(12) United States Patent
Wang et al.

(10) Patent No.: US 11,233,222 B2
(45) Date of Patent: Jan. 25, 2022

(54) DISPLAY PANEL, METHOD FOR MANUFACTURING THE SAME AND DISPLAY APPARATUS HAVING DISCONTINUOUS THIN FILM PACKAGE LAYERS OVER DISPLAY DEVICES

(71) Applicant: BOE Technology Group Co., Ltd., Beijing (CN)

(72) Inventors: Tao Wang, Beijing (CN); Song Zhang, Beijing (CN); Tao Sun, Beijing (CN); Ziyu Zhang, Beijing (CN); Chengjie Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/652,519

(22) PCT Filed: Oct. 23, 2019

(86) PCT No.: PCT/CN2019/112747
§ 371 (c)(1),
(2) Date: Mar. 31, 2020

(87) PCT Pub. No.: WO2020/083308
PCT Pub. Date: Apr. 30, 2020

(65) Prior Publication Data
US 2021/0226161 A1    Jul. 22, 2021

(30) Foreign Application Priority Data
Oct. 24, 2018 (CN) .......................... 201811242862.X

(51) Int. Cl.
*H01L 51/52* (2006.01)
*H01L 51/56* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC .............. H01L 51/5237; H01L 51/524; H01L 51/5243; H01L 51/5246; H01L 51/525;
(Continued)

(56) References Cited

U.S. PATENT DOCUMENTS

2015/0207097 A1* 7/2015 Reusch ................. H01L 51/442
257/40
2015/0303406 A1* 10/2015 Kim .................... H01L 51/5256
257/40
(Continued)

FOREIGN PATENT DOCUMENTS

CN           1744341 A        3/2006
CN         103150965 A        6/2013
(Continued)

OTHER PUBLICATIONS

First Office Action dated Nov. 8, 2019 for application No. CN201811242862.X with English translation attached.
(Continued)

*Primary Examiner* — Michael Jung
(74) *Attorney, Agent, or Firm* — Nath, Goldberg & Meyer; Joshua B. Goldberg

(57) ABSTRACT

A display panel, a method for manufacturing the same and a display device are provided. The display panel includes: a substrate; a plurality of display devices on a side of the substrate; and a plurality of thin film package layers on a side of the display devices distal to the substrate and cover the plurality of display devices. Orthographic projections of the plurality of thin film package layers on the substrate are discontinuous. At least one of the plurality of thin film
(Continued)

package layers covers at least one of the plurality of display devices.

15 Claims, 8 Drawing Sheets

(51) Int. Cl.
*H01L 27/32* (2006.01)
*H01L 51/00* (2006.01)

(52) U.S. Cl.
CPC .......... *H01L 51/524* (2013.01); *H01L 51/525* (2013.01); *H01L 51/5237* (2013.01); *H01L 51/5243* (2013.01); *H01L 51/5246* (2013.01); *H01L 51/5256* (2013.01); *H01L 51/56* (2013.01); *H01L 2227/323* (2013.01); *H01L 2251/5338* (2013.01)

(58) Field of Classification Search
CPC .. H01L 51/5253; H01L 51/5256; H01L 51/56
See application file for complete search history.

(56) References Cited

U.S. PATENT DOCUMENTS

| | | | |
|---|---|---|---|
| 2016/0028043 A1* | 1/2016 | Kwon | H01L 51/5253 257/40 |
| 2016/0181574 A1 | 6/2016 | Zeng et al. | |
| 2019/0165328 A1* | 5/2019 | Yi | H01L 51/56 |
| 2019/0363267 A1* | 11/2019 | Tanaka | G09F 9/30 |
| 2021/0108310 A1* | 4/2021 | Miyamoto | C23C 16/042 |

FOREIGN PATENT DOCUMENTS

| | | |
|---|---|---|
| CN | 107863376 A | 3/2018 |
| CN | 108598287 A | 9/2018 |
| CN | 108615822 A | 10/2018 |
| CN | 109411625 A | 3/2019 |
| CN | 109545998 A | 3/2019 |
| JP | 2010205503 A | 9/2010 |
| WO | 2014041616 A | 3/2014 |

OTHER PUBLICATIONS

Second Office Action dated Apr. 14, 2020 for application No. CN201811242862.X with English translation attached.
Third Office Action dated Aug. 11, 2020 for application No. CN201811242862.X with English translation attached.

* cited by examiner

DISPLAY PANEL, METHOD FOR MANUFACTURING THE SAME AND DISPLAY APPARATUS HAVING DISCONTINUOUS THIN FILM PACKAGE LAYERS OVER DISPLAY DEVICES

CROSS-REFERENCE TO RELATED APPLICATIONS

This is a National Phase Application filed under 35 U.S.C. 371 as a national stage of PCT/CN2019/112747, filed Oct. 23, 2019, an application claiming the benefit of Chinese Application No. 201811242862.X, filed Oct. 24, 2018, the content of each of which is hereby incorporated by reference in its entirety

TECHNICAL FIELD

The present disclosure relates to the technical field of display technology, and in particular to a display panel, a method for manufacturing the same, and a display apparatus.

BACKGROUND

With the development of flexible display technology, display panels tend to be stretchable. A stretchable display panel includes a stretchable substrate, a stretchable thin film transistor (TFT), a stretchable package layer, and the like. In order to realize stretchability of the package layer, display structures on the substrate are packaged based on regions (e.g., packaged region by region) to separate the package layers for different regions from each other, so that the package structure can better adapt to the stress applied when the display panel is stretched.

SUMMARY

As an aspect, a display panel is provided. The display panel includes: a substrate; a plurality of display devices on a side of the substrate; and a plurality of thin film package layers on a side of the plurality of display devices distal to the substrate and cover the plurality of display devices. Orthographic projections of the plurality of thin film package layers on the substrate are discontinuous, and at least one of the plurality of thin film package layers covers at least one of the plurality of display devices.

In an embodiment, the display panel includes a symmetry axis. The plurality of thin film package layers are on two sides of the symmetry axis and are arranged along a direction perpendicular to the symmetry axis.

In an embodiment, the orthographic projections of the plurality of thin film package layers on the substrate have a rectangular shape extending along the symmetry axis; and widths of the plurality of thin film package layers along the direction perpendicular to the symmetry axis gradually decrease along a direction away from the symmetry axis.

In an embodiment, the plurality of thin film package layers are arranged in an array; the orthographic projections of the plurality of thin film package layers on the substrate are discontinuous along a direction parallel to the symmetry axis; the orthographic projections of the plurality of thin film package layers on the substrate are discontinuous along the direction perpendicular to the symmetry axis; and the orthographic projections of the plurality of thin film package layers on the substrate have a same area.

In an embodiment, the orthographic projections of the plurality of thin film package layers on the substrate are arranged around a center, and respectively arranged in a radial direction from the center to an edge of the display panel.

In an embodiment, the orthographic projections of the plurality of thin film package layers on the substrate are a plurality of circular rings; and the distances, along the radial direction, between orthographic projections of every two adjacent thin film package layers on the substrate gradually increase along a direction away from the center.

In an embodiment, each of the plurality of thin film package layers is equally divided into a plurality of portions extending in a circumferential direction.

In an embodiment, each of the thin film package layers includes a first inorganic package layer, an organic package layer, and a second inorganic package layer sequentially arranged along a direction from the substrate to the display devices.

In an embodiment, the second inorganic package layer entirely covers two side walls of the organic package layer and a surface of the organic package layer distal to the substrate.

In an embodiment, the organic package layer and the second inorganic package layer form as one set; and a plurality of sets of organic package layer and second inorganic package layer are sequentially stacked on a side of the first inorganic layer distal to the substrate.

In an embodiment, a plurality of first opening sets are in the plurality of thin film package layers, such that the orthographic projections of the plurality of thin film package layers on the substrate are discontinuous.

In an embodiment, each of the plurality of first opening sets includes a first opening, a second opening and a third opening; the first opening is in the first inorganic package layer, and an orthographic projection of the first opening on the substrate falls between two adjacent display devices adjacent to the first opening; the second opening is in the second inorganic package layer, and an orthographic projection of the second opening on the substrate falls within a range defined by the orthographic projection of the first opening on the substrate; the third opening is in the organic package layer, the second opening corresponds to at least a portion of the third opening, and the orthographic projection of the second opening on the substrate falls within a range defined by an orthographic projection of the third opening on the substrate.

In an embodiment, the orthographic projection of the first opening on the substrate entirely overlaps the orthographic projection of the second opening on the substrate.

In an embodiment, a plurality of second opening sets are in the plurality of thin film package layers, such that each of the plurality of thin film package layers is equally divided into a plurality of portions extending in a circumferential direction.

In an embodiment, each of the second opening sets includes a fourth opening, a fifth opening and a sixth opening; the fourth opening is in the first inorganic package layer, and an orthographic projection of the fourth opening on the substrate falls between two adjacent display devices adjacent to the fourth opening; the fifth opening is in the second inorganic package layer, and an orthographic projection of the fifth opening on the substrate falls within a range defined by the orthographic projection of the fourth opening on the substrate; the sixth opening is in the organic package layer, the fifth opening corresponds to at least a portion of the sixth opening, and the orthographic projection of the fifth opening on the substrate falls within a range defined by an orthographic projection of the sixth opening on the substrate.

In an embodiment, the plurality of display devices are OLED display devices.

As an aspect, a display apparatus including the above display panel is provided.

As an aspect, a method for manufacturing the display panel includes: forming a plurality of display devices on a side of a substrate; forming a first inorganic package material layer covering the plurality of display devices on the substrate; forming an organic package material layer on a side of the first inorganic package material layer distal to the substrate; patterning the organic package material layer to form an organic package layer; forming a second inorganic package material layer on a side of the organic package layer distal to the substrate, such that the second inorganic package material layer covers exposed surfaces of the organic package layer and the first inorganic package material layer; and performing an etching process on the first inorganic package material layer and the second inorganic package material layer to form an opening between adjacent display devices of the plurality of display devices.

DETAILED DESCRIPTION

To enable one of ordinary skill in the art to better understand the technical solutions of the present disclosure, the present disclosure will be further described in detail below with reference to exemplary embodiments and the accompanying drawings.

A package layer is usually formed directly on a substrate by means of chemical vapor deposition and the like and then is patterned by using a metal mask to form a patterned package layer. When the package layer is manufactured with the metal mask, an edge of the formed package layer has a region having a width of 50 um to 300 um and a nonuniform thickness. Since the region has a far larger size than that of a pixel unit and the nonuniform thickness, the display devices in the region have a poor package effect, and the reliability of the manufactured display panel cannot be ensured. Therefore, the package layer in the prior art is still an entire layer structure covering the display panel, thereby resulting in a crack of the package layer when the package layer is stretched, and a great threat to the reliability of the display panel.

Figure 1:
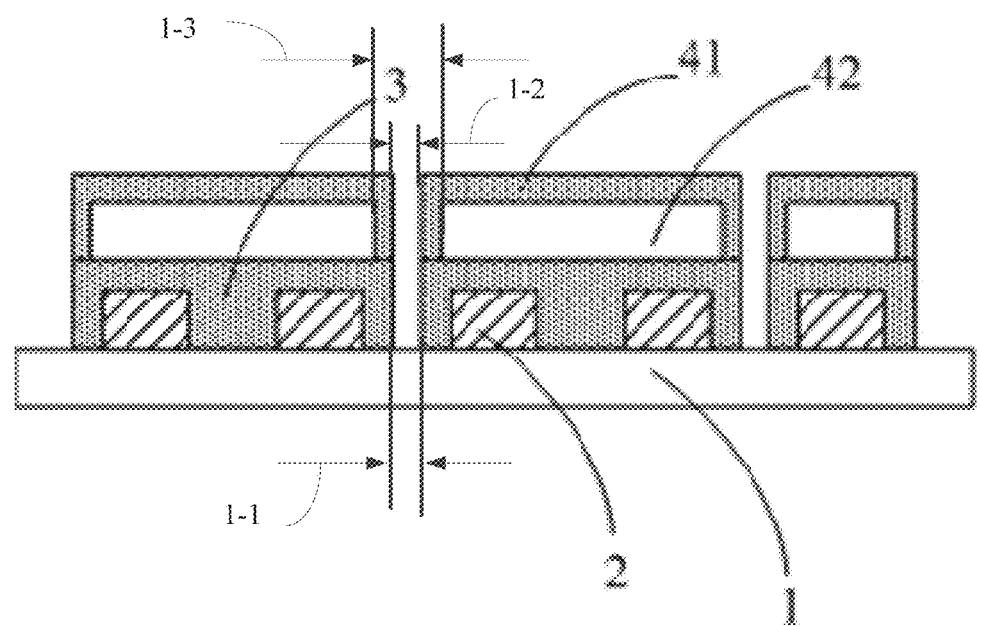
FIGS. 1 and 2 are schematic diagrams showing a structure of a display panel according to an embodiment of the present disclosure.

FIG. 1 is a schematic diagram showing a structure of a display panel according to an embodiment of the present disclosure. As shown in FIG. 1, the present embodiment provides a display panel, in particular, a stretchable display panel. The display panel includes: a substrate 1; a plurality of display devices 2 arranged in an array and spaced apart from each other on the substrate 1; and a plurality of thin film package layers located on a side of the display devices distal to the substrate and covering the plurality of display devices 2. Orthographic projections of the plurality of thin film package layers on the substrate 1 are discontinuous, and at least one thin film package layer of the plurality of thin film package layers covers at least one display device 2 of the plurality of display devices.

The thin film package layer includes a pre-package layer 3 (i.e., a first inorganic package layer), an organic package layer 42, and an inorganic package layer 41 sequentially arranged along a direction that is perpendicular to the substrate 1 and is from the substrate 1 to the display device 2 of the display panel.

The thin film package layers described above constitute the package structure of the present embodiment to realize package of the display devices 2 of the display panel. The package of the display device 2 is mainly implemented by the inorganic package layers (i.e. the pre-package layer 3 and the inorganic package layer 41), and the organic package layer 42 is mainly used for reducing the stress between two adjacent inorganic package layers 41, so that the single inorganic package layer 41 is not easy to crack along a thickness direction of the display panel. In the present embodiment, the package structure in which the inorganic package layer overlaps the organic package layer can be formed on the substrate 1 by using the thin film package layer. In the package structure, both the layer structure closest to the substrate 1 (i.e., the pre-package layer 3) and the layer structure farthest from the substrate 1 (i.e., the inorganic package layer 41 farthest from the substrate 1) are inorganic package layers, thereby ensuring a package effect on the display devices 2.

In the present embodiment, a plurality of first opening sets are located in the plurality of thin film package layers, such that orthographic projections of the plurality of thin film package layers on the substrate are discontinuous. The first opening set includes a first opening 1-1, a second opening 1-2, and a third opening 1-3.

The pre-package layer 3 has the first openings 1-1 corresponding to space regions between adjacent display devices 2; in at least one of thin film package sets, the inorganic package layer 41 has the second openings 1-2 corresponding to the space regions between adjacent display devices 2; the organic package layer 42 has the third openings 1-3. The second opening 1-2 corresponds to at least a portion of the third opening 1-3, and an orthographic projection of the second opening 1-2 on the substrate 1 is within a range defined by an orthographic projection of a corresponding third opening 1-3 on the substrate 1.

Since the inorganic package layers in the package structure are mainly used for implementing the package effect on the display devices 2 of the display panel, in the present embodiment the openings (i.e., the first openings in the pre-package layer 3 and the second openings in the inorganic package layer 41) are formed in at least one inorganic package layer in the package structure, so that the package structure can better adapt to the stress applied when the display panel is stretched, thereby not easily resulting in a crack of the package structure when the display panel is stretched, and improving the package reliability of the display devices 2. The openings may have any shape, and the shapes of the opening are not limited herein.

It should be noted herein that positions of the openings in the inorganic package layers should correspond to the space regions between adjacent display devices 2 of the display panel. As shown in FIG. 1, a region between adjacent display devices 2 on the display panel is one space region. The orthographic projection of the first opening on the substrate 1 should fall into the corresponding space region, such that the orthographic projection of a pattern of the pre-package layer 3 on the substrate 1 can cover each of the display devices 2 to ensure the package effect on the display devices 2. Similarly, the orthographic projection of the second opening 1-2 of the inorganic package layer 41 on the substrate 1 should be smaller than and fall within the orthographic projection of the corresponding space region on the substrate 1.

Since the organic package layer 42 has a poor package function and cannot block the corrosion of external water and oxygen to the display devices 2 very well, in the present embodiment the inorganic package layer 41 having the openings may cover the organic package layer 42 adjacent to the inorganic package layer 41 and located on a side of the inorganic package layer 41 proximal to the substrate 1. For example, the inorganic package layer 41 entirely covers two sidewalls of the organic package layer 42 and one surface of the organic package layer 42 distal to the substrate 1, such that the organic package layer 42 is not exposed (that is, in a same thin film package set, the inorganic package layer 41 should cover the organic package layer 42 located below the inorganic package layer 41 and be directly in contact with the inorganic package layer 41), thereby preventing the external water and oxygen from entering the organic package layer 42 to affect the product performance of the display panel.

In the present embodiment, the organic package layer 42 has the third openings 1-3, that is, it is not easily resulted in a crack of the organic package layer 42 when the display panel is stretched by providing the third openings 1-3. Specifically, as shown in FIG. 1, the openings 1-1, 1-2, 1-3 are formed in both of the inorganic package layer 41 and the organic package layer 42. The third opening 1-3 is formed at a position of the organic package layer 42 corresponding to the second opening 1-2 of the inorganic package layer 41, and the third opening 1-3 in the organic package layer 42 is larger than the second opening 1-2 in the inorganic package layer 41 (that is, the orthographic projection of the third opening in the organic package layer 42 on the substrate 1 overlaps and is larger than the orthographic projection of the second opening in the inorganic package layer 41 on the substrate 1), such that patterns of the inorganic package layer 41 cover corresponding patterns of the organic package layer 42, and all the side surfaces of the display device 2 except the side surface of the display device 2 proximal to the substrate 1 are covered by the inorganic package layer 41, thereby improving the package effect on the display device 2. It is understood that, as shown in FIG. 1, the third opening may be formed at a position in the organic package layer 42 covered by the inorganic package layer 41, which is not limited in the embodiment.

In an embodiment, when the pre-package layer 3 has the first openings 1-1 therein, the inorganic package layer 41 of the thin film package set has the second openings 1-2 therein, and the organic package layer 42 has the third openings 1-3 therein, the first openings, the second openings, and the third openings are arranged correspondingly (e.g., the first openings are in a one-to-one correspondence with the second openings, the second openings are in a one-to-one correspondence with the third openings, and the first openings are in a one-to-one correspondence with the third openings). The orthographic projection of the first opening on the substrate 1 overlaps, for example entirely overlaps, the orthographic projection of the corresponding second opening on the substrate 1 (that is, the first openings are in one-to-one correspondence with the second openings, and each of the first openings has the same shape and size as those of each of the second openings). The orthographic projection of each of the first opening and the second opening on the substrate 1 falls, for example, entirely falls into, the orthographic projection of the corresponding third opening on the substrate 1. Therefore, when the package structure of the display panel is manufactured, a pre-package material layer 3a, the patterned organic package layer 42 and an inorganic package material layer 41a of the thin film package set can be manufactured in sequence, and then the patterned pre-package layer 3 and the patterned inorganic package layer 41 of the thin film package set are formed through a one-step patterning process, thereby simplifying the manufacturing process of the display panel.

Figure 2:
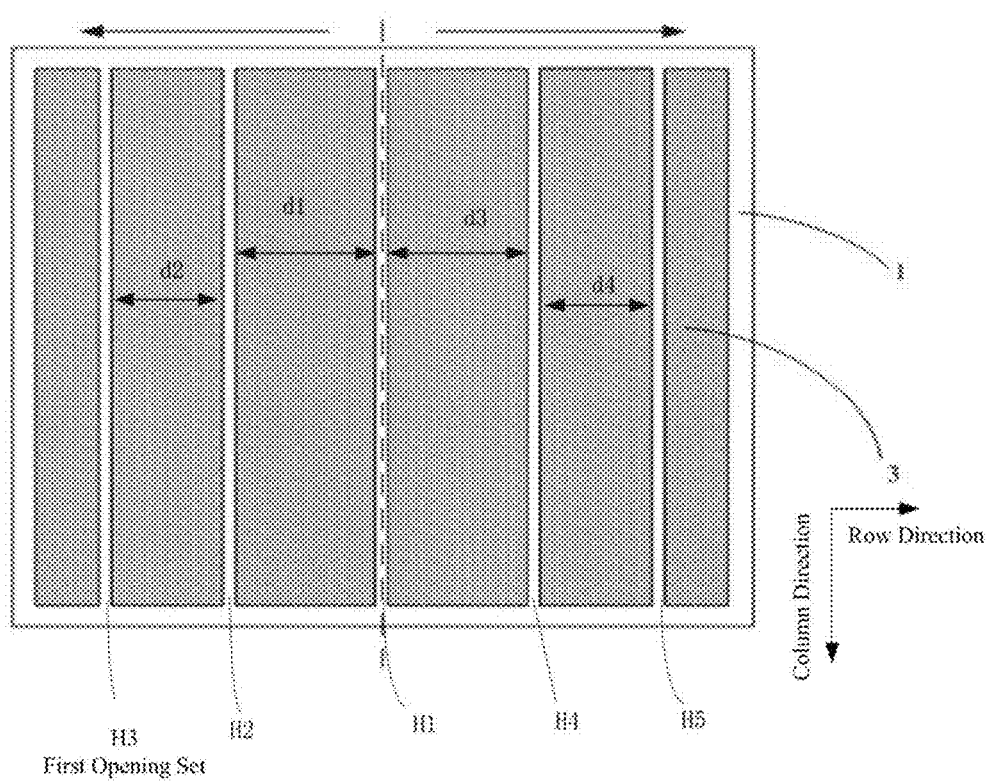

FIG. 2 is a schematic diagram showing a structure of a display panel according to an embodiment of the present disclosure. As shown in FIG. 2, the present embodiment provides a display panel, in particular a stretchable OLED panel. The OLED panel has a row direction and a column direction, wherein the row direction refers to a horizontal direction, and the column direction refers to a vertical direction perpendicular to the horizontal direction. An embodiment in which the package structure includes a pre-package layer 3, an organic package layer, and an inorganic package layer, and the pre-package layer 3, the organic package layer and the inorganic package layer are all provided with openings is taken as an example for detailed description.

The display panel in the present embodiment has a fixed end and a stretched end. When the display panel is stretched, the display panel has a stretching direction from the fixed end to the stretched end. In the present embodiment, the fixed end is not necessarily a fixed position of the display panel, but may also be a position where the display panel is subjected to the minimum stress when the display panel is stretched, and specifically, may be a center of the display panel that is subjected to stretching forces in different directions. The stretched end may be a position where the display panel is subjected to the maximum stress when the display panel is stretched. It is understood that the fixed end may be a fixed point, or a line or plane formed by a plurality of points. The stretched end may be a fixed point, or a line or plane formed by a plurality of points. Specifically, when the display panel is stretched by the same tension on two side edges of the display panel, the fixed end is a line formed by the middle points along the stretching direction of the display panel, and the stretched ends are the two side edges of the display panel. When the display panel is stretched by the same tension on the circumference of the display panel, the fixed end is the center of the display panel, and the stretched end is the edge (i.e., the circumference) of the display panel. In the present embodiment, a case where the stretched ends are two side edges of the display panel in a row direction (i.e., the horizontal direction in FIG. 2, and the direction indicated by the horizontal arrows is the stretching direction) and the fixed end is a symmetry axis (i.e., the vertical dotted line along the column direction in FIG. 2) of the display panel is taken as an example for description.

As shown in FIG. 2, a plurality of OLED display devices, which are arranged with an interval therebetween, are formed on a substrate 1. A plurality of thin film package layers each including the pre-package layer 3, the organic package layer 42, and the inorganic package layer 41 are sequentially formed on a side of the OLED display devices distal to the substrate 1.

The plurality of thin film package layers are positioned on two sides of the symmetry axis and are arranged along a direction perpendicular to the symmetry axis.

An orthogonal projection of each of the thin film package layers has a rectangular shape, and extends along the symmetry axis (or along the column direction).

The pre-package layer 3 has a plurality of first openings, and each of the first openings corresponds to a space region between adjacent display devices 2. The inorganic package layer 41 of the thin film package set has a plurality of second openings, and each of the second openings corresponds to a space region between adjacent display devices 2.

As shown in FIG. 2, the pre-package layer 3 in the present embodiment has a plurality of first openings. The distances between adjacent first opening sets gradually decrease along a direction from the fixed end to the stretched end. For example, along the stretching direction to the left, a distance between the first opening sets H1 and H2 is d1, and a distance between the first opening sets H3 and H2 is d2, wherein d1>d2. Along the stretching direction to the right, a distance between the first opening sets H1 and H4 is d3, and a distance between the first opening sets H4 and H5 is d4, wherein d3>d4.

Similar to the pre-package layer 3, the inorganic package layer 41 of the thin film package set has a plurality of second openings. The distances between adjacent second openings gradually decrease along a direction from the fixed end to the stretched end.

Specifically, taking the pre-package layer 3 having the first openings as an example, as shown in FIG. 2, along the stretching direction of the display panel, the distance d1 between two adjacent first opening sets H1 and H2 in the middle region is greater than the distance d2 between two adjacent first opening sets H2 and H3 in the edge region, that is, the number (e.g., 3) of the display devices 2 corresponding to a pattern of the pre-package layer 3 between two adjacent first opening sets H1 and H2 in the middle region is greater than the number (e.g., 2) of the display devices 2 corresponding to a pattern of the pre-package layer 3 between two adjacent first opening sets H2 and H3 in the edge region.

In an embodiment, widths of the plurality of thin film package layers along the row direction decrease along a direction away from the symmetry axis. The widths of the plurality of thin film package layers along the row direction decrease along a direction from the fixed end to the stretched end.

The widths of the plurality of thin film package layers along the row direction are so set for the following considerations. In practical applications, a size of the display device 2 is very small, and the requirement on the opening precision of the mask is high. Therefore, in the present embodiment, the first openings in the pre-package layer 3 only correspond to some of all the space regions of the display panel (i.e., no first opening is provided in some space regions), thereby reducing the requirement on the opening precision of the mask and reducing the manufacturing difficulty of the display panel. Meanwhile, when the display panel is stretched, the stresses are different at different positions. The closer to the stretched end (i.e., force applying end), the greater the stress is, so that the film layer at the position is more easily to crack. Therefore, in the embodiment, the requirement on the opening precision of the mask is reduced, and the pre-package layer 3 is more adaptive to the stretching force applied when the substrate is stretched by designing the distances between the openings so that the risk of cracks of the pre-package layer 3 is reduced too. Similarly, the second openings of the inorganic package layers 41 in the thin film package set may also be arranged in the same manner, so as to reduce the risk of cracks of the inorganic package layers 41 and the requirement on the opening precision of the mask.

In an embodiment, in a top view, the first openings in the pre-package layer 3 corresponds (e.g., parallel) to each other along the column direction, that is, the first openings located between any two adjacent columns of display devices 2 communicate with each other at upper and lower portions of the display panel. The second openings in the inorganic package layers 41 of the thin film package set correspond (e.g., parallel) to each other along the column direction, that is, the second openings located between any two adjacent columns of the display devices 2 communicate with each other at the upper and lower portions of the display panel.

As shown in FIG. 2, when a certain layer structure (e.g., the pre-package layer 3) has the openings, the plurality of openings adjacent to each other along the stretching direction communicate with each other at the upper and lower portions of the display panel. It is understood that when the stretching direction of the display panel is parallel to a row direction of the display panel, the first openings are arranged along the row direction and extend to the upper and lower portions of the display panel along the column direction. The first opening corresponding to the space region between two display devices 2 adjacent to each other along the row direction (i.e., adjacent to each other in the left and right direction) may extend to the upper and lower edges of the display region of the display panel along the column direction, and no opening is formed along the row direction in the top view.

Meanwhile, when the stretching direction of the display panel is only parallel to the row direction of the display panel, the layer structures of the display panel is not stretched along a direction (i.e., the vertical direction or the column direction of the display panel in FIG. 2) perpendicular to the stretching direction, and thus no crack is generated, and therefore a plurality of openings can be arranged only along the row direction of the display panel. As shown in FIG. 2, the pre-package layer 3 of the display panel is divided to stripe patterns by the plurality of openings, and each of the stripe patterns extends along the column direction and covers one or more columns of display devices 2.

It will be understood that depending on the particular forced direction, the distances between the openings can be set as the case may be. As shown in FIG. 2, when the display panel is stretched from the middle to both sides along a direction parallel to the row direction of the display panel, the pre-package layer 3 between two adjacent column rows of first openings in the middle region of the display panel correspondingly covers one or more columns of display devices 2. The closer to the edge region, the less the number of columns of display devices 2 corresponding to the pre-package layer 3 between two adjacent columns of first openings is. The specific number of columns of the display devices 2 corresponding to the pre-package layer 3 between two adjacent columns of the first openings can be set as the case may be, which is not limited herein.

Figure 3:
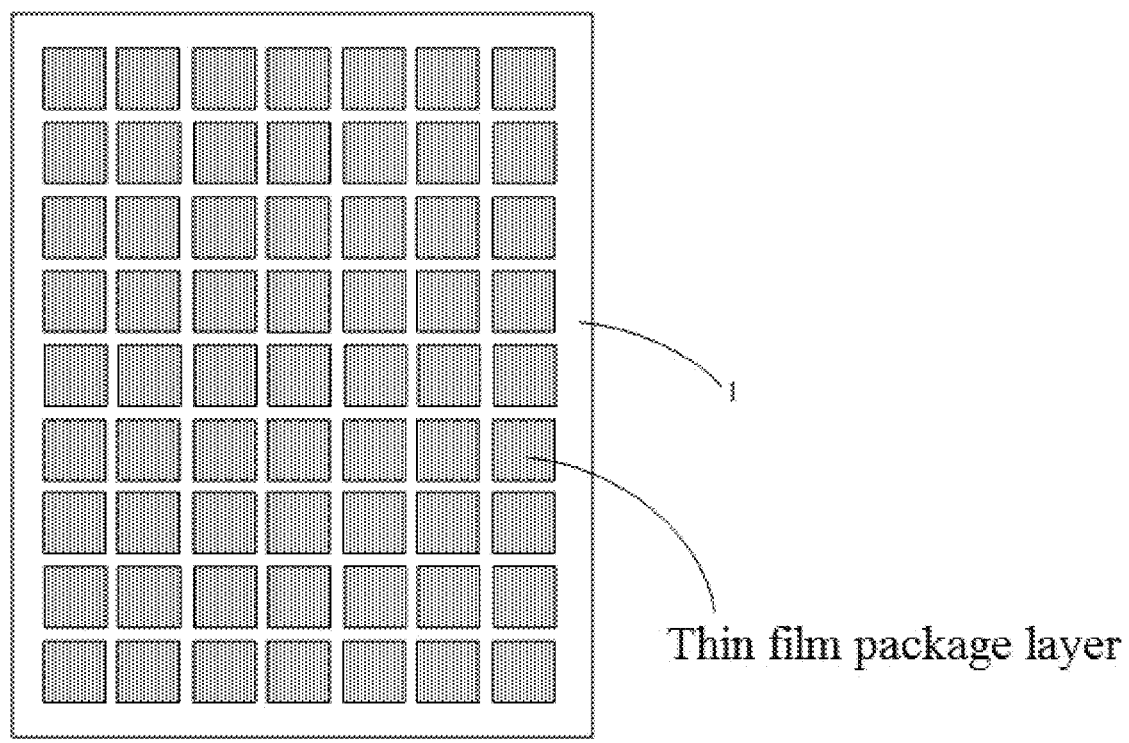
FIG. 3 is a schematic diagram showing a structure of a display panel according to an embodiment of the present disclosure.

FIG. 3 is a schematic diagram showing a structure of a display panel according to an embodiment of the present disclosure. As shown in FIG. 3, the present embodiment provides a display panel, for example, a stretchable OLED panel, in which the package structure includes the pre-package layer 3, the organic package layer 42, and the inorganic package layer 41. An embodiment in which the pre-package layer 3, the organic package layer 42, and the inorganic package layer 41 are all provided with the openings is taken as an example for description.

Similar to the second embodiment, the display panel in the present embodiment has a fixed end and a stretched end. When the display panel is stretched, the display panel has a stretching direction from the fixed end to the stretched end. When the display panel has a plurality of stretched end, the display panel may have a plurality of different stretching directions.

In the display panel of the present embodiment, a plurality of OLED display devices are arranged with an interval therebetween in an array on the substrate 1. A pre-package layer 3, an organic package layer 42, and an inorganic package layer 41 are sequentially formed on a side of the OLED display devices distal to the substrate 1.

As shown in FIG. 3, orthographic projections of the plurality of thin film package layers on the substrate are discontinuous along a direction parallel to the symmetry axis. The orthographic projections of the plurality of thin film package layers on the substrate are also discontinuous along a direction perpendicular to the symmetry axis.

In an embodiment, the first openings in the pre-package layer 3 are located at position corresponding to the space regions between every N rows of display devices 2, where N is greater than or equal to 1 and less than half of the total number of rows. The first openings are located at position corresponding to the space regions between every M columns of display devices 2, where M is greater than or equal to 1 and less than half of the total number of columns. The second openings in the inorganic package layer 41 are located at positions corresponding to the space regions between every N rows or M columns of display devices 2.

In an embodiment, when M=N, the orthographic projections of the plurality of thin film package layers on the substrate have square shapes. When M≠N (i.e., M is not equal to N), the orthographic projections of the plurality of thin film package layers on the substrate have rectangular shapes.

In an embodiment, as shown in FIG. 3, display devices arranged in a 2×2 array are packaged by one thin film package layer, and display devices arranged in a 2×2 array on the right of the above-mentioned display devices arranged in a 2×2 array are packaged by another thin film package layer, and so on. In this case, the orthographic projections of the thin film package layers on the substrate have square shapes with the same area.

In an embodiment, it is understood that display devices arranged in a 2×3 array are packaged by one thin film package layer, and display devices arranged in a 2×3 array on the right of the above-mentioned display devices arranged in a 2×3 array are packaged by another thin film package layer, and so on. In this case, the orthographic projections of the thin film package layers on the substrate have rectangle shapes with the same area.

In an embodiment, an opening is formed between any two display devices adjacent to each other in the row direction, and an opening is formed between any two display devices adjacent to each other in the column direction, such that one thin film package layer packages only one display device.

The openings are formed at positions in the pre-package layer 3, the organic package layer 42 and the inorganic package layer 41 corresponding to any one of space regions, therefore the pre-package layer 3, the organic package layer 42 and the inorganic package layer 41 can adapt to the stretching of the display panel to the greatest extent, thereby improving the package reliability of the package structure, and prolonging the service life of the display panel.

In an embodiment, the first openings of the pre-package layer 3 corresponding to the space regions between every M columns of display devices 2 communicate with each other at the edge of the display panel, and the first openings of the pre-package layer 3 corresponding to the space regions between every N rows of display devices 2 communicate with each other at the edge of the display panel. The second openings of the inorganic package layer 41 corresponding to the space regions between every M columns of the display devices 2 communicate with each other at the edge of the display panel, and the second openings of the inorganic package layer 41 corresponding to the space regions between every N rows of the display devices 2 communicate with each other at the edge of the display panel.

In an embodiment, a part of the first openings extend along the row direction, and the remaining part of the first openings extend along the column direction, such that the remaining part of the first openings and the part of the first openings are perpendicular to each other to form a grid. As shown in FIG. 3, as many openings as possible are formed in portions of the package film layer between the display devices of the display panel so as to adapt to tension in different directions.

Figure 4:
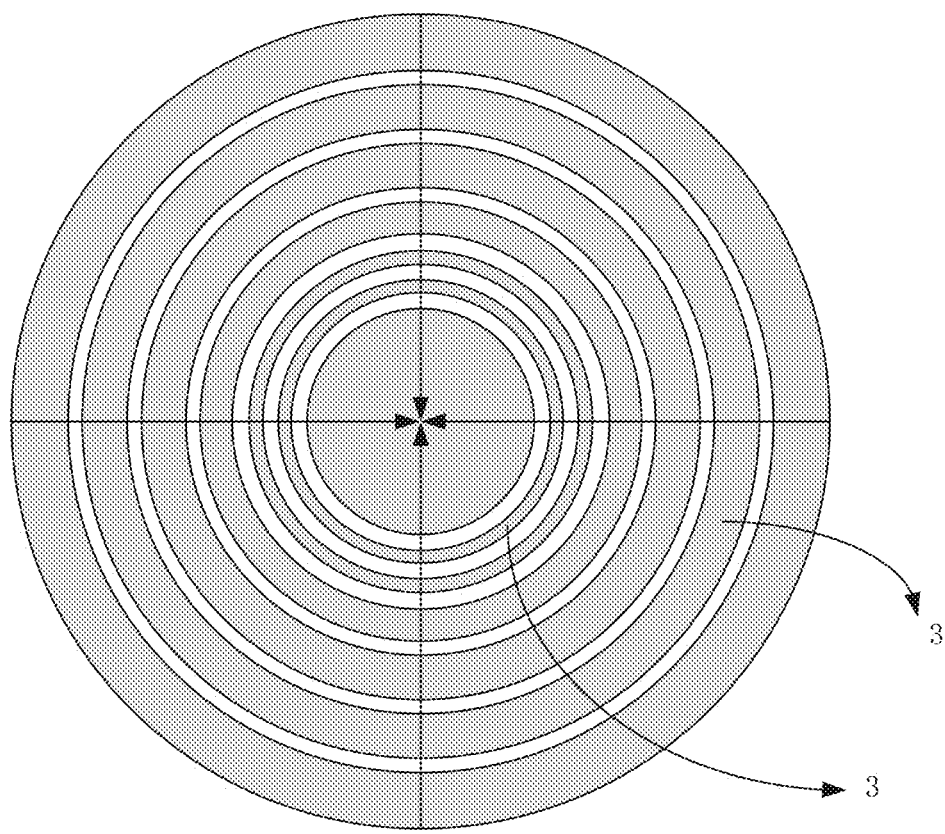
FIG. 4 is a schematic diagram showing a structure of a display panel according to an embodiment of the present disclosure.
Figure 5:
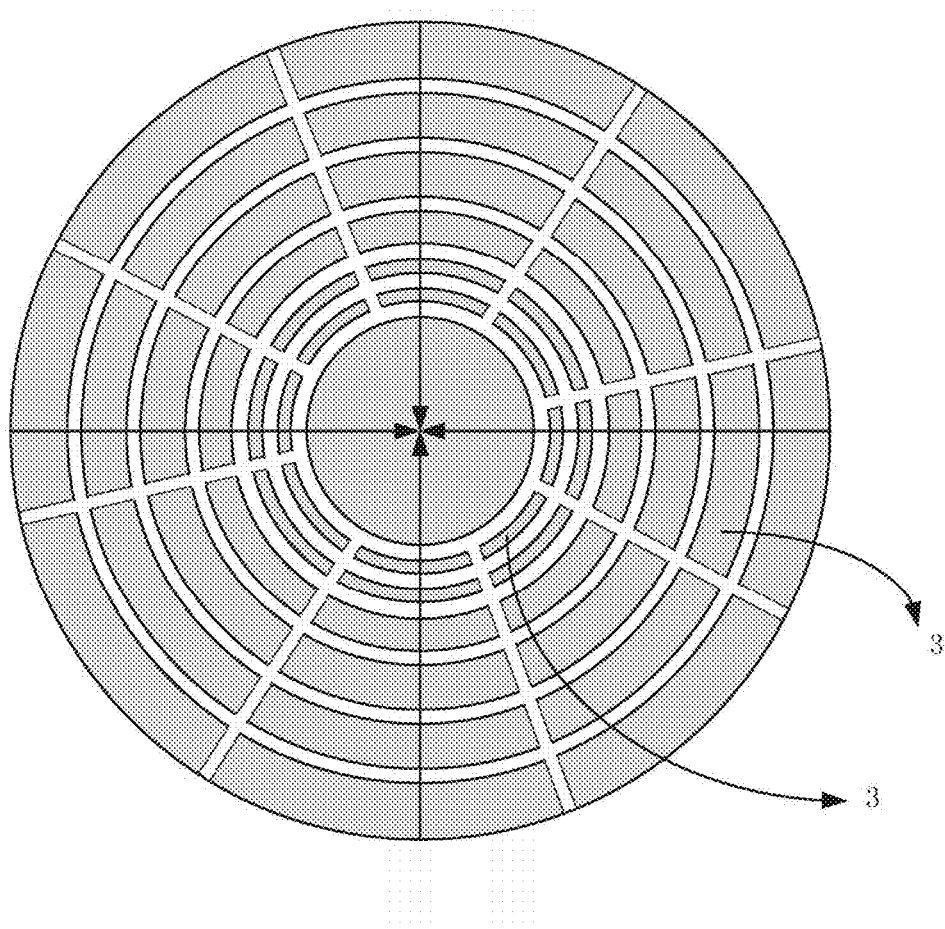
FIG. 5 is a schematic diagram showing a structure of a display panel according to an embodiment of the present disclosure.

FIG. 4 is a schematic diagram showing a structure of a display panel according to an embodiment of the present disclosure, and FIG. 5 is a schematic diagram showing a structure of a display panel according to an embodiment of the present disclosure. As shown in FIGS. 4 and 5, the present embodiment provides a display panel, in particular, a stretchable display panel. At least part of the outline of the display region of the display panel has an arc shape in a top view.

The present embodiment in which the display region has a circular shape will be described. In order to achieve a narrow border of the display panel, the display panel may have a circular shape that matches to the display region. Alternatively, the display panel may also have a square shape or other shapes, which is not limited herein.

The display panel in the present embodiment has a fixed end and a stretched end. When the display panel is stretched, the display panel has a stretching direction from the fixed end to the stretched end (the stretching direction is indicated by an arrow as shown). Specifically, the present embodiment in which the fixed end is located at an edge of the display region and the stretched end is located at a center (i.e., the center of FIG. 4) of the display region will be described as an example.

In the present embodiment, the display panel includes: multiple rings of display devices 2 (i.e., display devices 2 disposed in multiple rings) arranged along the outline of the display region; the pre-package layer 3, the organic package layer 42 and the inorganic package layer 41 arranged in sequence along a direction away from the substrate and on a side of the display device 2 distal to the substrate. The pre-package layer 3 is an inorganic package layer.

The pre-package layer 3 has first openings, and the orthographic projection of each first opening on the substrate 1 falls into a space region between two adjacent rings of display devices 2 corresponding to the first opening. The inorganic package layer 41 of at least one of thin film package sets has second openings, and orthographic projection of each second opening on the substrate 1 falls into a space region between two adjacent rings of display devices 2 corresponding to the second opening. The organic package layer 42 has third openings. The second openings correspond to at least a portion of the third openings, and an orthographic projection of each second opening on the substrate 1 falls within a range defined by an orthographic projection of a corresponding third opening on the substrate 1.

The pre-package layer 3 of the display panel is taken as an example, as shown in FIG. 4, the display devices 2 on the display panel are uniformly arranged with a center of the display region as the center, such that the display devices 2 form a plurality of concentric rings on the display panel. The first opening in the pre-package layer 3 corresponds to the space region between two adjacent rings of display devices 2. When the stretching direction of display panel is towards the centre of the display panel (that is, the fixed end is the edge of the display panel, and the stretched end is the center of the display panel). For example, when the planar circular display panel is stretched to a spherical display panel, the pre-package layer 3 can better adapt to the stress applied when the display panel is stretched with the design of the first openings, thereby not easily resulting in a crack of the pre-package layer 3 when the display panel is stretched, and improving the package reliability of the display devices 2. Similarly, the stretching capability of the inorganic package layer 41 in the thin film package set can be enhanced through the arrangement of the second openings.

In the display panel of the present embodiment, the inorganic package layer 41 of the thin film package set has the second openings, and the organic package layer 42 of the thin film package set has the third openings. That is, the organic package layer 42 is not easily cracked due to the arrangement of the third openings when the display panel is stretched. Referring to FIG. 4 and FIG. 1, the third opening may be formed at a position of the organic package layer 42 corresponding to the second opening of the inorganic package layer 41, and the third opening in the organic package layer 42 is larger than the second opening in the inorganic package layer 41, such that the patterns of the inorganic package layer 41 covers the corresponding patterns of the organic package layer 42, and all the side surfaces of the display device 2 except the side surface of the display device 2 proximal to the substrate 1 are covered by the inorganic package layer 41, thereby improving the package effect on the display device 2. It is understood that, the third opening may be formed at a position in the organic package layer 42 covered by the inorganic package layer 41, which is not limited in the embodiment.

The section view along the radial direction in FIG. 4 is similar to FIG. 1. As shown in FIG. 4, the first opening 1-1, the second opening 1-2, and the third opening 1-3 constitute a first opening set. One of a plurality of first openings is formed between two adjacent rings of display devices 2, that is, a plurality of first opening sets are formed on the display panel. Each of the plurality of first opening sets extends along a circumferential direction of the display region to form one annular opening. Multiple annular openings are arranged in concentric rings around the center of the display panel.

In an embodiment, the orthogonal projections of the plurality of thin film package layers on the substrate are arranged around the center, and respectively arranged in a radial direction from the center to the edge of the display panel. The orthographic projections of the plurality of thin film package layers on the substrate are circular rings.

When the stretching direction of the display panel is a direction from the center to the edge of the display panel, since the center of the display panel is heavily stressed, the distances between every two adjacent rings of first openings may gradually increase along the radial direction of the display panel (i.e., a direction from the center to the edge of the display panel), so that the package structure can better adapt to the stretching of the display panel. Alternatively, the distance, along the radial direction, between orthographic projections of two adjacent thin film package layers on the substrate gradually increase along a direction away from the center of the display panel.

In an embodiment, when the display panel is stretched at multiple positions on the edge of the display panel, the display panel is subjected to a circumferential stretching force, while the display panel is subjected to a radial stretching force. Therefore, in the display panel of the present embodiment, each of the plurality of thin film package layers is equally divided by a plurality of second opening sets into a plurality of portions extending in the circumferential direction.

In an embodiment, the plurality of second opening sets are formed in the pre-package layer, the inorganic package layer, and the organic package layer. The plurality of second opening sets respectively extend along the radial direction of the display region of the display panel, and intersect and communicate with each of the plurality of first opening sets, so that the package structure can better adapt to the stretching of the display panel.

Figure 11:
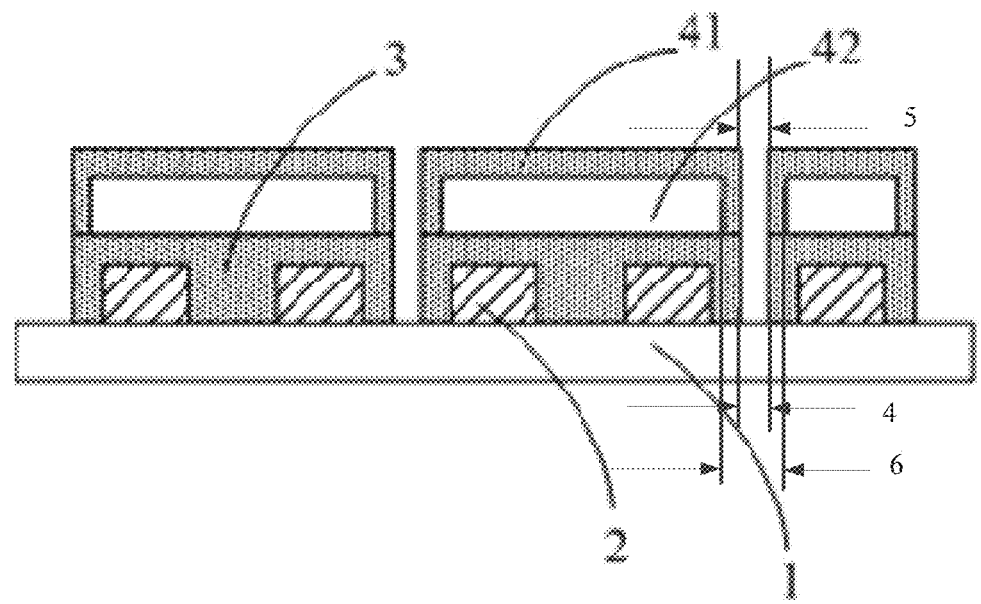
FIG. 11 is a section view along a circumferential direction in FIG. 5.

The section view along the circumferential direction in FIG. 5 is similar to FIG. 1 and is shown in FIG. 11. Each of the second opening set includes a fourth opening 4, a fifth opening 5, and a sixth opening 6. The pre-package layer 3 has fourth openings 4, and an orthographic projection of the fourth opening on the substrate falls into the space region between two adjacent display devices in the same ring of display devices. That is, as shown in FIG. 5, in addition to the first openings of the pre-package layer 3 formed at the positions between every two adjacent rings of display devices, the fourth openings may be formed at the positions of the pre-package layer 3 corresponding to the space regions between every two adjacent display devices in the same ring of display devices.

The first openings may intersect and communicate with the plurality of fourth openings to form one annular opening. That is, the plurality of first openings adjacent to each other along the radial direction of the circular display panel may communicate with each of the fourth openings to form the annular openings, such that a plurality of openings in a shape of concentric circular ring can be formed on the display panel, thereby improving the stretching performance of the pre-package layer 3, and reducing the manufacturing difficulty of the display panel.

Similarly, the inorganic package layer 41 has fifth openings 5 therein, and an orthographic projection of the fifth opening on the substrate 1 falls within a space region between two adjacent display devices 2 in the same ring of display devices 2. Alternatively, the orthographic projection of the fifth opening on the substrate falls within a range defined by the orthographic projection of the corresponding fourth opening on the substrate. The organic package layer 42 has sixth openings 6, each sixth opening corresponds to at least a portion of a corresponding fifth opening, and the orthographic projection of the fifth opening on the substrate 1 falls within a range defined by an orthographic projection of a corresponding sixth opening on the substrate 1. That is, the fifth opening may be formed in the inorganic package layer 41 and formed in the space region between two adjacent display devices 2 in the same ring of display devices, and the sixth opening may be formed at a position of the organic package layer 42 corresponding to the fifth opening, so that the organic package layer 42 can better adapt to the stretching of the circular display panel. The inorganic package layer 41 covers the organic package layer 42 to wrap the organic package layer 42 therein, thereby ensuring the package effect.

The plurality of fourth openings may be formed, and correspondingly, the plurality of fifth openings and the plurality of sixth openings may be formed. The fourth openings are arranged along the circumferential direction of the display panel, and extend along the radial direction of the display panel, so that the pre-package layer 3 may better adapt to the stretching of the display panel. The plurality of fifth openings and the plurality of sixth openings are also arranged along the circumferential direction of the display panel, and extend along the radial direction of the display panel.

An embodiment of the present disclosure provides a display apparatus including any one of the above display panels. The display apparatus in the present embodiment is a stretchable OLED display apparatus that specifically may be any product or component with a display function, such as a mobile phone, a tablet computer, a television, a display, a notebook computer, an advertisement screen and the like.

Since the display apparatus of the present embodiment includes the display panel according to any one of the above embodiments, when the display device is stretched, the pre-package layer 3 and the inorganic package layer of the thin film package layer and the like in the display device still have good reliability, therefore the display apparatus of the present embodiment has better display performance and longer service life as compared to the display apparatus in the prior art.

FIGS. 6 to 10 are diagrams illustrating a method for manufacturing a display panel according to an embodiment of the present disclosure. The method may be used for manufacturing any one of the display panels provided in the embodiments of the present disclosure. The preparation method includes the following steps: forming a plurality of display devices 2 on a substrate 1, and forming a pre-package layer 3, an organic package layer, and an inorganic package layer in sequence on the substrate 1 on which the display devices 2 are formed. The pre-package layer 3 is an inorganic package layer.

The method for manufacturing the display panel of the embodiment includes: a step of forming first openings in the pre-package layer 3, wherein the first openings correspond to space regions between adjacent display devices 2, respectively; a step of forming second openings in the inorganic package layer 41; and a step of forming third openings in the organic package layer 42. An orthographic projection of the third opening on the substrate 1 falls into a space region between adjacent display devices 2 corresponding to the third opening, and a region between two adjacent display devices 2 is one space region. The second opening corresponds to at least a portion of the third opening, and the orthographic projection of each second opening on the substrate falls within (e.g., entirely falls within) a range defined by the orthographic projection of the corresponding third opening on the substrate 1. That is, the openings are formed in the layers of the package structure of the display panel, so that the package structure can better adapt to the stress applied when the display panel is stretched, thereby not easily resulting in a crack of the package structure when the display panel is stretched, and improving the package reliability of the package structure for the display devices 2. The positions of the openings (i.e., the first openings, the second openings, and the third openings) correspond respectively to the space regions between the adjacent display devices 2, so that the openings are prevented from affecting the package effect of the display devices 2.

In order to describe the method for manufacturing the display panel in the present embodiment more specifically, an embodiment in which the display panel is a stretchable OLED display panel with the first openings formed in the pre-package layer 3, the second openings formed in the inorganic package layers 41 and the third openings formed in the organic package layers 42, and the first openings, the second openings, and the third openings are formed in one-to-one correspondence with each other will be described as an example. The method for manufacturing the display panel includes the following steps.

Step S1, a pixel defining layer and the display devices 2 are formed on the substrate 1.

The pixel defining layer includes a plurality of containing portions for defining pixel units. In the present embodiment, the pixel defining layer further includes a plurality of openings for dividing the pixel defining layer into several portions so as to adapt stretching of the display panel. The openings correspond respectively to the space regions between adjacent containing portions. Specifically, the containing portions and the openings may be formed by an etching process in this step.

Figure 6:
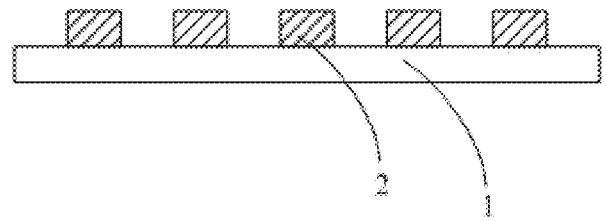
FIG. 6 is a schematic diagram showing a structure of a display device formed in a method for manufacturing a display panel according to an embodiment of the present disclosure.

As shown in FIG. 6, when the display devices 2 are formed, in order to ensure a normally operation of the display devices 2 when the display panel is stretched, it is necessary to separate the display devices 2 from each other. Specifically, when the display devices 2 are manufactured, inverted trapezoidal pillars may be formed between adjacent display devices 2, respectively, thereby separating the formed display devices 2 from each other.

Step S2, a pre-package material layer 3a is formed on the substrate 1.

The substrate 1 is a flexible stretchable substrate 1 with the pixel defining layer and the OLED display devices 2 formed thereon.

Figure 7:
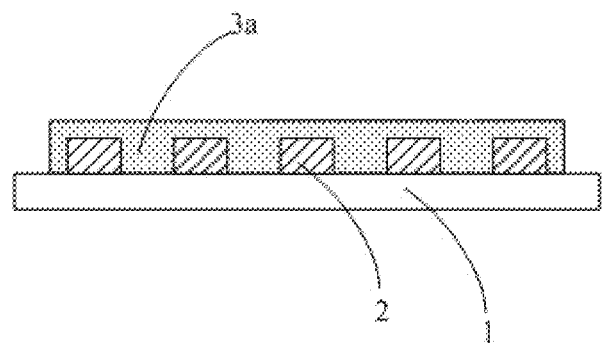
FIG. 7 is a schematic diagram showing a structure of a pre-package material layer formed in a method for manufacturing a display panel according to an embodiment of the present disclosure.

As shown in FIG. 7, in step S2, an entire pre-package material layer 3a may be deposited by a Plasma Enhanced Atomic Layer Deposition (PEALD) process, a magnetron sputtering coating (Sputter) process, a Plasma Enhanced Chemical Vapor Deposition (PECVD) process, or the like.

Specifically, a material of the pre-package material layer 3a may be inorganic insulation material, for example, silicon dioxide.

Step S3, an organic package material layer is formed on a side of the pre-package material layer 3a distal to the substrate 1, and the organic package layer 42 having the third openings is formed through a patterning process.

Figure 8:
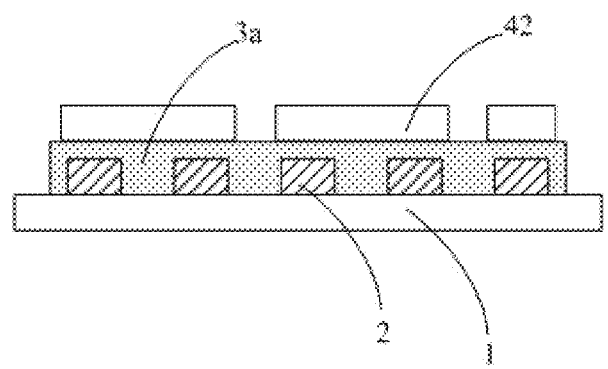
FIG. 8 is a schematic diagram showing a structure of an organic package layer of a thin film package set formed in a method for manufacturing a display panel according to an embodiment of the present disclosure.

As shown in FIG. 8, in step S3, the organic package layer 42 having the third openings may be formed by a flash evaporation process, a printing process, a screen printing process, a PECVD process, or the like.

Step S4, an inorganic package material layer 41a is formed on a side of the organic package layer 42 distal to the substrate 1.

Figure 9:
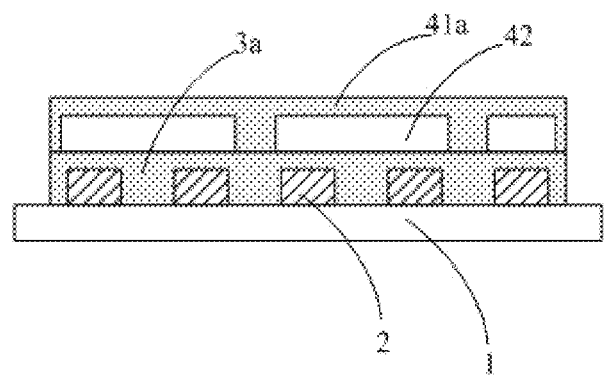
FIG. 9 is a schematic diagram showing a structure of an inorganic package layer of a thin film package set formed in a method for manufacturing a display panel according to an embodiment of the present disclosure.

As shown in FIG. 9, in step S4, similar to step S2, the entire inorganic package material layer is formed on the substrate 1. The details of manufacturing process and materials may refer to that in step S2, which is omitted herein.

A covering surface of the inorganic package material layer 41a should be not smaller than covered surfaces of the pre-package material layer 3a and the organic package layer 42, so as to prevent the organic package layer 42 from being exposed to affect the package effect of the package structure.

Step S5, the pre-package layer 3 having the first openings and the inorganic package layer 41 having the second openings are formed by a one-step etching process.

Specifically, the etching process may include dry etching, wet etching, or the like.

Figure 10:
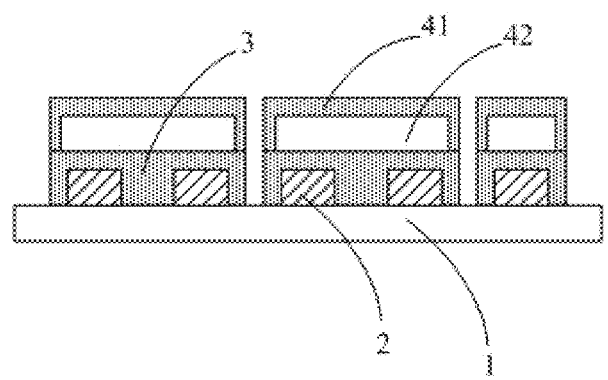
FIG. 10 is a schematic diagram showing a structure of a pre-package layer having a first opening and an inorganic package layer having a second opening that are formed in a method for manufacturing a display panel according to an embodiment of the present disclosure.

As shown in FIG. 10, in step S5, a portion of the material of the pre-package material layer 3a and a portion of the material of the inorganic package material layer are removed by a one-step etching process to form the pre-package layer 3 having the first openings and the inorganic package layer 41 having the second openings, thereby simplifying the manufacturing process of the display panel.

Both the first opening and the second opening correspond to a portion of the third opening in the patterned organic package layer 42. In the present embodiment, a portion of the pre-package layer and a portion of the inorganic package layer corresponding to each third opening contact with each other, and portions of the two inorganic package layers (i.e., the pre-package layer and the inorganic package layer) corresponding to at least a portion of the third opening may be removed by etching through a one-step patterning process, so as to form the first opening in the pre-package layer and the second opening in the inorganic package layer. The pre-package material layer 3a and the inorganic package material layer are etched once. Of course, since the first openings and the second openings are in one-to-one correspondence with each other but the first openings or the second openings do not need to be in one-to-one correspondence with the third openings, only the material at some of the positions of the pre-package layer 3a and the inorganic package material layer corresponding to the third opening may be removed.

It is understood that, in the present embodiment, the organic package layer 42 and the inorganic package layer 41 constitute one set. When a plurality of sets of organic package layers 42 and inorganic package layers 41 are formed, steps S3 and S4 may be repeated for many times. The plurality of sets of organic package layers 42 and inorganic package layers 41 are sequentially stacked on the substrate 1 along a direction from the substrate 1 to the display devices 2, and each set of organic package layers 42 and inorganic package layers 41 includes one organic package layer 42 having the third openings and the one inorganic package layer 41 which is formed as one piece. And then step S5 is performed to form the pre-package layer 3 having the first openings and the inorganic package layer 41 having the second openings in each thin film package set by a one-step patterning process.

The detailed steps for forming the display devices, the pre-package layer, the organic package layer, the inorganic package layer, and the like in the present embodiment may be referred to the steps shown in FIGS. 6 to 10, and are omitted here.

It is to be understood that the above embodiments are merely exemplary embodiments for explaining the principles of the present disclosure, and the present disclosure is not limited thereto. It will be apparent to one of ordinary skill in the art that various changes and modifications may be made therein without departing from the spirit and essence of the present disclosure, and these changes and modifications also fall within the scope of the present disclosure.

What is claimed is:

1. A display panel, comprising:
   a substrate;
   a plurality of display devices, on a side of the substrate; and
   a plurality of thin film package layers, on a side of the plurality of display devices distal to the substrate and cover the plurality of display devices, wherein
   orthographic projections of the plurality of thin film package layers on the substrate are discontinuous, and
   at least one of the plurality of thin film package layers covers at least one of the plurality of display devices,
   each of the thin film package layers comprise a first inorganic package layer, an organic package layer, and a second inorganic package layer sequentially arranged along a direction from the substrate to the display devices,
   the display panel further comprises a plurality of first opening sets in the plurality of thin film package layers, such that the orthographic projects of the plurality of thin film package layers on the substrate are discontinuous,
   each of the plurality of first opening sets comprises a first opening, a second opening and a third opening,
   the first opening is in the first inorganic package layer, and an orthographic projection of the first opening on the substrate falls between two adjacent display devices adjacent to the first opening,
   the second opening is in the second inorganic package layer, and an orthographic projection of the second opening on the substrate falls within a range defined by the orthographic projection of the first opening on the substrate, and
   the third opening is in the organic package layer, the second opening corresponds to at least a portion of the third opening, and the orthographic projection of the second opening on the substrate falls within a range defined by an orthographic projection of the third opening on the substrate.

2. The display panel according to claim 1, wherein the display panel comprises a symmetry axis, and the plurality of thin film package layers are on two sides of the symmetry axis and are arranged along a direction perpendicular to the symmetry axis.

3. The display panel according to claim 2, wherein the orthographic projections of the plurality of thin film package layers on the substrate have a rectangular shape extending along the symmetry axis, and widths of the plurality of thin film package layers along the direction perpendicular to the symmetry axis gradually decrease along a direction away from the symmetry axis.

4. The display panel according to claim 2, wherein
the plurality of thin film package layers are arranged in an array,
the orthographic projections of the plurality of thin film package layers on the substrate are discontinuous along a direction parallel to the symmetry axis,
the orthographic projections of the plurality of thin film package layers on the substrate are discontinuous along the direction perpendicular to the symmetry axis, and
the orthographic projections of the plurality of thin film package layers on the substrate have a same area.

5. The display panel according to claim 1, wherein
the orthographic projections of the plurality of thin film package layers on the substrate are arranged around a center of a display region, and respectively arranged in a radial direction from the center to an edge of the display panel.

6. The display panel according to claim 5, wherein
the orthographic projections of the plurality of thin film package layers on the substrate are a plurality of circular rings, and
the distances, along the radial direction, between orthographic projections of every two adjacent thin film package layers on the substrate gradually increase along a direction away from the center.

7. The display panel according to claim 6, wherein
each of the plurality of thin film package layers is equally divided into a plurality of portions extending in a circumferential direction.

8. The display panel according to claim 1, wherein
the second inorganic package layer entirely covers two side walls of the organic package layer and a surface of the organic package layer distal to the substrate.

9. The display panel according to claim 1, wherein
the organic package layer and the second inorganic package layer form as one set, and
a plurality of sets of organic package layer and second inorganic package layer are sequentially stacked on a side of the first inorganic layer distal to the substrate.

10. The display panel according to claim 1, wherein
the orthographic projection of the first opening on the substrate entirely overlaps the orthographic projection of the second opening on the substrate.

11. The display panel according to claim 1, further comprising a plurality of second opening sets, wherein
the plurality of second opening sets are in the plurality of thin film package layers, such that each of the plurality of thin film package layers is equally divided into a plurality of portions extending in a circumferential direction.

12. The display panel according to claim 11, wherein
each of the second opening sets comprises a fourth opening, a fifth opening and a sixth opening,
the fourth opening is in the first inorganic package layer, and an orthographic projection of the fourth opening on the substrate falls between two adjacent display devices adjacent to the fourth opening,
the fifth opening is in the second inorganic package layer, and an orthographic projection of the fifth opening on the substrate falls within a range defined by the orthographic projection of the fourth opening on the substrate, and
the sixth opening is in the organic package layer, the fifth opening corresponds to at least a portion of the sixth opening, and the orthographic projection of the fifth opening on the substrate falls within a range defined by an orthographic projection of the sixth opening on the substrate.

13. The display panel according to claim 1, wherein
the plurality of display devices are OLED display devices.

14. A display apparatus comprising the display panel of claim 1.

15. A method for manufacturing a display panel, wherein the display panel is the display panel according to claim 1, and wherein the method comprises:
forming a plurality of display devices on a side of a substrate;
forming a first inorganic package material layer covering the plurality of display devices on the substrate;
forming an organic package material layer on a side of the first inorganic package material layer distal to the substrate;
patterning the organic package material layer to form an organic package layer;
forming a second inorganic package material layer on a side of the organic package layer distal to the substrate, such that the second inorganic package material layer covers exposed surfaces of the organic package layer and the first inorganic package material layer; and
performing an etching process on the first inorganic package material layer and the second inorganic package material layer to form an opening between adjacent display devices of the plurality of display devices,
wherein performing the etching process on the first inorganic package material layer and the second inorganic package material layer comprises: forming a plurality of first opening sets in the first inorganic package material layer, the organic package layer and the second inorganic package material layer, such that orthographic projections of the first inorganic package material layer, the organic package layer and the second inorganic package material layer are discontinuous,
each of the plurality of first opening sets comprises a first opening, a second opening and a third opening,
the first opening is in the first inorganic package layer, and a orthographic projection of the first opening on the substrate falls between two adjacent display devices adjacent to the first opening,
the second opening is in the second inorganic package layer, and an orthographic project of the second opening on the substrate falls within a range defined by the orthographic projection of the first opening on the substrate, and
the third opening is in the organic package layer, the second opening corresponds to at least a portion of the third opening, and the orthographic projection of the second opening on the substrate falls within a range define by an orthographic projection of the third opening on the substrate.

* * * * *